United States Patent
Herkommer et al.

(10) Patent No.: US 7,321,468 B2
(45) Date of Patent: Jan. 22, 2008

(54) METHOD AND OPTICAL ARRANGEMENT FOR BEAM GUIDING OF A LIGHT BEAM WITH BEAM DELAY

(75) Inventors: Alois Herkommer, Aalen (DE); Holger Muenz, Aalen (DE); Wolfgang Seifert, Aalen (DE)

(73) Assignee: Carl Zeiss Laser Optics GmbH (DE)

( * ) Notice: Subject to any disclaimer, the term of this patent is extended or adjusted under 35 U.S.C. 154(b) by 78 days.

(21) Appl. No.: 11/013,188

(22) Filed: Dec. 15, 2004

(65) Prior Publication Data
US 2005/0128483 A1    Jun. 16, 2005

Related U.S. Application Data

(60) Provisional application No. 60/529,604, filed on Dec. 15, 2003.

(51) Int. Cl.
G02B 27/10 (2006.01)
G02B 27/12 (2006.01)
G02B 5/08 (2006.01)
H01S 3/081 (2006.01)
H01S 3/08 (2006.01)

(52) U.S. Cl. ............ 359/618; 359/639; 359/861; 372/93; 372/98; 372/100; 372/101

(58) Field of Classification Search ............ 359/618, 359/637, 639, 640, 837, 850, 857, 861; 372/92, 372/93, 98, 99, 100, 101
See application file for complete search history.

(56) References Cited

U.S. PATENT DOCUMENTS

| | | | |
|---|---|---|---|
| 5,309,456 A | 5/1994 | Horton | 372/25 |
| 5,337,333 A | 8/1994 | Daly et al. | 372/94 |
| 5,661,748 A | 8/1997 | Zahavi et al. | 372/108 |
| 6,067,311 A | 5/2000 | Morton et al. | 372/57 |

(Continued)

FOREIGN PATENT DOCUMENTS

DE    19931751 A1    1/2001

*Primary Examiner*—Ricky Mack
*Assistant Examiner*—Jack Dinh
(74) *Attorney, Agent, or Firm*—St. Onge Steward Johnston & Reens LLC

(57) ABSTRACT

A method for beam guiding of a light beam generated by a light source to a target location along a path distance $L_S$, comprises splitting the light beam on the path distance $L_S$ at least once into a first partial beam and a second partial beam, guiding the first partial beam additionally at least once along a delay line, the first partial beam thereby covering an additional path distance $L_D$, guiding the second partial beam only along the path distance $L_S$, combining the first and second partial beams after the first partial beam having passed through the delay line and guiding the combined beam to the target location, wherein the light beam is guided along the path distance $L_S$ and $L_D$ in such a way that the light beam generated by the light source has a predetermined beam width B at the target location, expanding the light beam between the light source and the target location at least once to a beam width B'>B and comprising the light beam again at least once in such a way that the light beam has the predetermined beam width B at the target location.

37 Claims, 3 Drawing Sheets

U.S. PATENT DOCUMENTS

| | | |
|---|---|---|
| 6,389,045 B1 | 5/2002 | Mann et al. .................. 372/25 |
| 6,535,531 B1 | 3/2003 | Smith et al. .................. 372/25 |
| 6,549,267 B1 | 4/2003 | Kudo ......................... 355/53 |
| 6,996,141 B1 * | 2/2006 | Schuster et al. ............... 372/30 |
| 2002/0191654 A1 | 12/2002 | Klene et al. .................. 372/25 |
| 2003/0043876 A1 | 3/2003 | Lublin et al. ................. 372/55 |

* cited by examiner

METHOD AND OPTICAL ARRANGEMENT FOR BEAM GUIDING OF A LIGHT BEAM WITH BEAM DELAY

PRIOR APPLICATION

Applicants claim priority benefits under 35 U.S.C. §119(e) of U.S. Provisional Patent Application Ser. No. 60/529,604 filed Dec. 15, 2003.

BACKGROUND OF THE INVENTION

The invention relates to a method for beam guiding of a light beam generated by a light source, in particular laser light source, to a target location along a path distance $L_S$.

The invention furthermore relates to an optical arrangement for beam guiding of a light beam generated by a light source, in particular laser light source, to a target location along a path distance $L_S$.

A specific application described in connection with the present invention is the use of the method mentioned in the introduction and of the optical arrangement mentioned in the introduction in semiconductor lithography.

In semiconductor lithography, laser light is used to image a mask onto a wafer by means of a projection exposure installation in order then to fabricate the desired semiconductor components lithographically from the wafer. In this case, particular attention is given to the beam guiding system that guides the light beam generated by the laser to the projection exposure installation.

Owing to the demand for very short-wave light, semiconductor lithography at the present time uses excimer lasers, by way of example, which generate a light beam constructed, by its nature, from laser pulses of very short temporal delimitation with the individual laser pulses having a length of a few 10 ns. Each pulse of the light beam has a high pulse energy of, by way of example, more than 5 mJ. This means that, as seen over the duration of an individual pulse each pulse has a very high power density. These high power densities can damage the downstream optical systems or shorten the service life thereof.

Therefore, it is necessary to increase the pulse duration of the laser pulses or to split each individual pulse into a plurality of temporally offset subpulses with no loss of energy, in order thus to lower the power density.

Optical delay lines are usually used for pulse multiplication or pulse elongation. For this purpose, the light beam generated by the light source, that is to say by the laser in the present application example, is split into two partial beams. In addition to the path distance $L_S$, one of the two partial beams correspondingly passes through the delay line with the path distance $L_D$, which is also to be understood to mean that one partial beam passes through the delay line a number of times, so that the total delay path distance $L_D$ is then attained. At the end of the delay line, the two partial beams are then recombined to form a single light beam that is guided further to the target location, the exposure installation in the present example.

In this case, the problem exists that the light beam generated by the light source naturally has a beam divergence, i.e. becomes wider and wider as the path distance increases. On the other hand, the beam reaching the target location ought not to exceed a maximum beam width B in order to ensure a complete utilization of the light beam at the target location, i.e. in the exposure installation in the present case.

In order to achieve a sufficient reduction of the peak power of the individual pulses, however, large path distances $L_D$ are required for one partial beam. Large delay path distances $L_D$ have the effect, however, that on account of the natural divergence of the light beam, the delayed partial beam at the output of the delay line has a larger beam width than the non-delayed partial beam.

Therefore, previous optical arrangements for beam guiding, i.e. beam guiding systems, use delay lines in which the input of the delay line is imaged 1:1 onto the output of the delay line, and which thus ensure that the beam properties of the delayed beam essentially correspond to those of the undelayed beam. Upstream of the input of the delay line or downstream of the output of the delay line, the light beam generated by the laser is additionally shaped to the desired beam width B, said light beam usually being expanded since the light beam generated by the laser generally has a beam width that is less than the desired beam width B at the target location, i.e. at the exposure installation.

The use of the abovementioned delay lines having an imaging optic that images the input of the delay line onto the output of the delay line has the disadvantage, however, that additional focusing elements are required in the delay line, which constitute an additional cost expenditure. Furthermore, these imaging optics within the delay line generate intermediate foci which constitute a high radiation burden per volume and accordingly have to be well purged or arranged remote from optical elements. Moreover, the optical elements, for example folding mirrors, present in the delay line are burdened to a greater extent by the focusing.

Beam guiding systems of this type are disclosed in the documents U.S. Pat. Nos. 6,549,267 B1, 6,535,531 B1 and 5,661,748 by way of example, which differ through the type of imaging optics in the delay lines. A refractive imaging optic, by way of example a Keppler telescope, is used as the imaging optic in the case of the document cited first, while the imaging of the input onto the output is achieved by means of spherical mirrors in the case of the documents cited last.

If, by contrast, imaging within the delay line is dispensed with, the disadvantage already mentioned arises in that the delayed partial beam, due to the natural divergence of the laser radiation and due to the longer propagation path via the delay line, no longer falls within the specified beam width range, but rather is increasingly fanned out over the propagation path, with the result that the predetermined beam width B desired at the target location is exceeded. Moreover, the recombined light beam thus has a greatly varying width over the entire lengthened pulse duration because the delayed partial beam has a greater beam width than the non-delayed partial beam. This has the effect that, at the target location, the light beam is not homogeneous over the cross section, as desired, but rather is inhomogeneous.

SUMMARY OF THE INVENTION

The invention is based on the object of specifying a method and an optical arrangement of the type mentioned in the introduction which enable the light beam to be supplied to the target location with the desired beam width B in conjunction with essentially homogeneous distribution of the light intensity in the beam cross section without this requiring, in the delay line, an imaging optic that images the input of the delay line onto the output thereof.

According to an aspect of the invention, a method for beam guiding of a light beam generated by a light source to a target location along a path distance $L_S$ is provided, comprising splitting said light beam on said path distance $L_S$ at least once into a first partial beam and a second partial beam, guiding said first partial beam additionally at least once along a delay line, said first partial beam thereby covering an additional path distance $L_D$, guiding said second partial beam only along said path distance $L_S$, combining said first and second partial beams after said first partial beam having passed through said delay line and guiding the combined beam to said target location, wherein said light beam is guided along said path distance $L_S$ and $L_D$ in such a way that said light beam generated by said light source has a predetermined beam width B at said target location, expanding said light beam between said light source and said target location at least once to a beam width B'>B and comprising said light beam again at least once in such a way that said light beam has said predetermined beam width B at said target location.

According to another aspect of the invention, an optical arrangement for beam guiding of a light beam generated by a light source to a target location along a path distance $L_S$ is provided, comprising at least one delay line having an input at which said light beam coming from said light source is split into a first partial beam which additionally passes through said delay line at least once, thereby covering a path distance $L_D$, and into a second partial beam that does not pass through said path distance $L_D$, and an output at which said delayed first and said non-delayed second partial beam are combined so that the combined light beam passes to said target location, a beam guiding optic being present in said beam path and being designed in such a way that said light beam generated by said light source has a predetermined beam width B at said target location, said beam guiding optic having at least one expansion optic, which expands said light beam to a beam width B'>B, and said beam guiding optic having at least one compression optic, with the result that said light beam has said predetermined beam width B at said target location.

The invention is based on the insight that it is possible to achieve significantly larger transmission distances for the light beam and thus significantly larger delay path distances $L_D$ if the light beam is expanded in the meantime to a beam width B' that is greater than the beam width B at the target location, since it has been recognized that the maximum transmission path from the light source to the target location on which the beam propagates with homogeneous intensity distribution is proportional to the square of the expansion of the light beam. If, as in the case of conventional beam guiding systems, the light beam coming from the light source were shaped or expanded only to the predetermined desired beam width B that is intended to prevail at the target location, the maximum transmission paths are limited to path distances that are insufficient, under certain circumstances, for sufficient pulse elongation or multiplication. The methods according to the invention and the optical arrangement according to the invention therefore make it possible to obtain transmission lengths that are significantly greater than in the case of conventional systems, in which case, over these greater transmission lengths, there is no significant change in the beam width over the entire delay length and the entire beam guiding length except for the interim greater beam expansion, without this requiring, within the delay line, imaging optics that image the input of the delay line onto the output thereof.

In preferred and advantageous refinements of the method, the procedure in this case may be such that the light beam is already completely expanded to the beam width B' before the first partial beam enters into the delay line, and the recombined light beam is compressed to the predetermined beam width B that is intended to prevail at the target location after one partial beam has passed through the delay line, that is to say downstream of the output of the delay line.

However, the procedure may also equally advantageously and preferably be such that only the first partial beam passing through the delay line is expanded to the beam width B'>B, i.e. this first partial beam passing through the delay line is expanded to the beam width B'>B after entering into the delay line and is compressed again before emerging from the delay line, preferably in such a way that the non-delayed partial beam and the delayed partial beam have the same beam width at the output of the delay line.

In this case, the light beam may preferably additionally be shaped or expanded to the beam width B upstream of the input of the delay line, in which case the first partial beam is expanded from the beam width B to the beam width B'>B downstream of the input into the delay line and is compressed to the beam width B again upstream of the output of the delay line, with the result that the delayed partial beam and the non-delayed partial beam have the beam width B at the output.

In a further preferred refinement of the method, the procedure may be such that the splitting of the light beam into the first partial beam and the second partial beam is effected in the expanding light beam, the first partial beam, after splitting, then ultimately being expanded to a beam width B'>B in the delay line and the second partial beam, which does not pass through the delay distance $L_D$, being expanded to the predetermined beam width B and the first partial beam being compressed to the beam width B again at the end of the delay line.

In this case, as in the previous case, it is advantageously possible to work with two expansion optics, which has the advantage that the overall focal length of the expansion optic in the delay line and the expansion optic in the direct beam guiding along the path distance $L_S$ can be adjusted independently of one another by slightly displacing the positive lenses of the expansion optics and it is thus possible to compensate for slight refractive powers of the mirrors that are caused, if appropriate, by tolerances of the deflection mirrors in the delay line.

Accordingly, in the case of this aforementioned refinement, in contrast to the refinements mentioned previously, the beam splitting takes place at the input of the delay line in the non-collimated beam path.

In preferred and advantageous refinements of the optical arrangement, the at least one expansion optic has an expansion factor $$m = \alpha \cdot \frac{B}{b}$$

where $\alpha > 1$, in order to expand the light beam to a beam width B'>B in the meantime, b being the beam width of the incident light beam.

In connection with one of the refinements of the method mentioned previously, the at least one expansion optic is arranged completely upstream of the input of the delay line, that is to say that the subsequent beam splitting takes place in the expanded, but collimated beam path.

In this case, the expansion optic preferably has an expansion factor $$m \geq \sqrt{(L_S + L_D) \cdot \frac{\vartheta}{B}},$$

θ being the divergence of the incident light beam.

In this case, it is further preferred if the compression optic is arranged in the region between the output of the delay line and the target location, it also being possible for the compression optic to be integrated in the target location, in the case where the arrangement is used in a semiconductor lithography system, for example in the input of the projection exposure installation.

In a further alternative refinement of the arrangement, the at least one expansion optic, which brings about an expansion to the beam width B'>B, is arranged completely in the delay line.

In this case, the at least one expansion optic has an expansion factor $$m \geq \sqrt{L_D \cdot \frac{\vartheta}{b}},$$

θ being the divergence and b being the beam width of the incident light beam.

In the case of this refinement, the compression optic is preferably likewise arranged in the delay line and preferably designed in such a way that the expansion of the first partial beam of the light beam by the expansion optic is reversed upstream of the output of the delay line; the light beam, in particular, is compressed to the beam width of the non-delayed partial beam.

If, upstream of the input of the delay line, the beam guiding optic has at least one further expansion optic, which is arranged completely upstream of the input of the delay line, this further expansion optic preferably has an expansion factor $$m \geq \sqrt{L_S \cdot \frac{\vartheta}{b}},$$

θ again being the divergence and b being the beam width of the incident light beam. In this case, the light beam may be shaped to the beam width B, for example, upstream of the input into the delay line, while the partial beam passing through the delay line is expanded to the beam width B'>B in the delay line, and is compressed to the beam width B again at the end of the delay line.

In this case, too, it is advantageous if the two expansion optics mentioned above have different expansion factors.

A further advantageous and preferred refinement of the invention consists in the fact that the at least one expansion optic has an optical input and an optical output at a distance therefrom, the optical input and the optical output in interaction bringing about the beam expansion, the light beam being collimated at the optical output, and that the input of the expansion optic is arranged upstream of the input of the delay line and the at least one output of the expansion optic is arranged within the delay line.

Accordingly, with this type of beam guiding optic or expansion optic, the beam splitting takes place in the expanding beam path.

In this case, it is preferred for the at least one compression optic to be arranged within the delay line, and it is furthermore preferred for the beam guiding optic to have at least one further expansion optic having an optical input that is preferably identical to the optical input of the first expansion optic and having an optical output that is arranged in the beam direction downstream of the output of the delay line.

In order, in this case as well, once again to achieve beam expansion to a beam width B'>B only within the delay line, while the non-delayed partial beam is only shaped or expanded to the beam width B, the two expansion optics mentioned above may once again have different expansion factors.

Preferably, in this case, the expansion factor of the first expansion optic for the delay line is chosen to be greater than the expansion factor of the at least one further expansion optic for the direct path distance $L_S$ to the target location.

In each of the refinements mentioned above, the focal length f of the at least one expansion optic is chosen in such a way that $f = m^2 \cdot b / \theta$.

In this case, the focal length f of the at least one expansion optic may be chosen to be different in two planes perpendicular to the beam direction and to one another.

Moreover, the expansion optic may be formed in such a way that the beam expansion differs in two directions that are different, for example perpendicular, with respect to the beam direction and with respect to one another. The abovementioned measures are advantageous in particular when the laser beam has different characteristic quantities (beam width, divergence) in two planes.

Lens systems having spherical or cylindrical lenses or mirror systems may be used for the abovementioned expansion optics.

It is equally preferred for at least one prism to be used for the at least one expansion optic, since said prism may simultaneously also be used as a beam splitter at the input and/or as a beam combining element at the output of the delay line, as a result of which the number of optical elements can advantageously be reduced.

Furthermore, the beam guiding optic may preferably have at least one optical element with variable refractive power, which enable adjustment of the focal length f of the beam guiding optic or of the at least one expansion optic, and/or compensation of undesirable refractive powers caused, by way of example, by tolerances or deformations of the folding mirrors used in the delay line, and/or adaptation of the beam guiding to different path distances $L_S$ and/or $L_D$. A variable adaptation of the optical arrangement according to the invention to different purposes of use can be made possible in this way.

In this case, it is furthermore preferred for the at least one optical element to be a deformable mirror or a displaceable lens.

Further advantages and features are apparent from the description below and the accompanying drawing.

It goes without saying that the features mentioned above and the features yet to be explained below can be used not only in the respectively specified combination, but also in other combinations or by themselves, without departing from the scope of the present invention.

BRIEF DESCRIPTION OF THE DRAWINGS

Exemplary embodiments of the invention are illustrated in the drawing and are described in more detail hereinafter with reference thereto. In the figures.

DETAILED DESCRIPTION OF PREFERRED EMBODIMENTS

Firstly, the principle of an optical arrangement for beam guiding of a light beam from a light source to a target location is described with reference to FIGS. 1 to 3. The basic relationships of the beam guiding are elucidated in this case.

Figure 1:
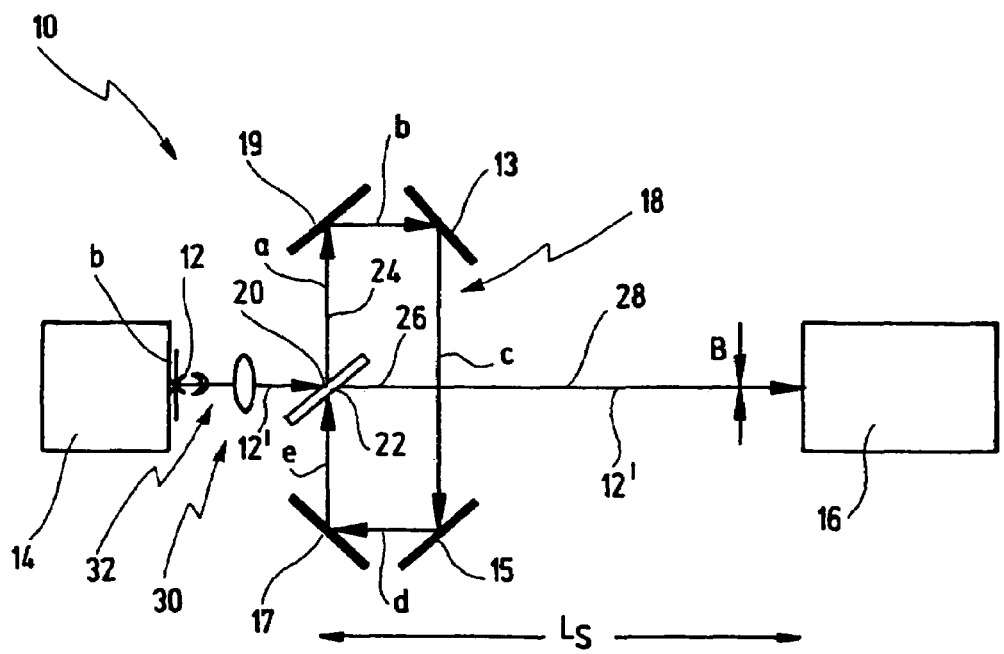
FIG. 1 shows a fundamental illustration of an optical arrangement for beam guiding of a light beam from a light source to a target location, for elucidating the basic relationships.

FIG. 1 illustrates an optical arrangement—provided with the general reference symbol 10—for beam guiding of a light beam 12 generated by a light source 14. The optical arrangement 10 has the function of guiding the light beam 12 to a target location 16, and if appropriate shaping said light beam.

In the case of the preferred use of the optical arrangement 10, the light source 14 is a laser, for example an excimer laser, which generates pulsed laser light, with the result that the light beam 12 is constructed from individual light pulses. In this application, the target location 16 is a projection individual light pulses. In this application, the target location 16 is a projection exposure installation, by way of example, by means of which the supplied light beam 12 is directed through a mask (not illustrated) onto a wafer (not illustrated) for the purpose of imaging the mask onto the wafer.

The optical arrangement 10 has a delay line 18 having an input 20 and an output 22. The light beam 12 coming from the light source 14 is firstly split at the input 20 into a first partial beam 24 and into a second partial beam 26.

In this case, the first partial beam 24 passes through the delay line 18 proceeding from the input 20 along the subdistances a, b, c, d, e to the output 22 of the delay line 18.

If the first partial beam 24 passes through the delay line 18 n times, then the first partial beam 24 overall covers the path distance $L_D = n \cdot (a+b+c+d+e)$ in the delay line 18.

At the output 22 of the delay line 18, the first partial beam 24 is combined with the second partial beam 26 again, the combined light beam 28 then being guided to the target location 16.

In contrast to the first partial beam 24, the second partial beam 26 overall covers only a path distance $L_S$, while the first partial beam 24 overall has covered the path distance $L_D + L_S$ up to the target location 16 (the path distance of the light beam 12 from the light source 14 to the input 20 of the delay line 18 has been disregarded in this case).

The different path distances covered by the delayed partial beam 24 and the non-delayed partial beam 26 up to the target location 16 lead to the following technical problems on account of the natural divergence of the light beam 12 generated by the light source 14, for example a laser.

At the target location 16, for example the projection exposure installation, the combined light beam 28 is intended to have a predetermined beam width B that should not be exceeded, because otherwise a part of the light beam 28 is masked out at the target location 16, for example a projection exposure installation, and thus cannot be utilized further.

In the case of the optical arrangement 10, use is conventionally made of a beam guiding optic 30 with an expansion optic 32, which expands the light beam generated by the light source 14, said light beam usually having the beam width b<B, to the beam width B, with the result that the light beam 12 is collimated after passage through the expansion optic 32 and has the beam width B.

While the non-delayed partial beam 26 can be guided to the target location 16 along the path distance $L_S$ without exceeding the beam width B in this way, the delayed partial beam 24, which has also passed through the path distance $L_D$ in addition to the path distance $L_S$, in the case of long path distances $L_D$, will exceed the beam width B either as early as at the output 22 of the delay line 18 but at the latest at the target location 16. The consequence is that the combined light beam 28 at the target location 16 exceeds the beam width B and, moreover, as seen over the cross section of the combined light beam 28, may have different intensity densities, that is to say is not homogeneous.

The aim achieved by the invention is therefore to shape the entire light beam 12, 24, 26, 28 by means of a specific choice of at least one beam guiding optic in such a way that its width does not change significantly either over the path distance $L_S$ or over the path distance $L_D$ and also over the path distance $L_S + L_D$.

For a better understanding of the invention, firstly the basic physical relationships are explained below.

Figure 2:
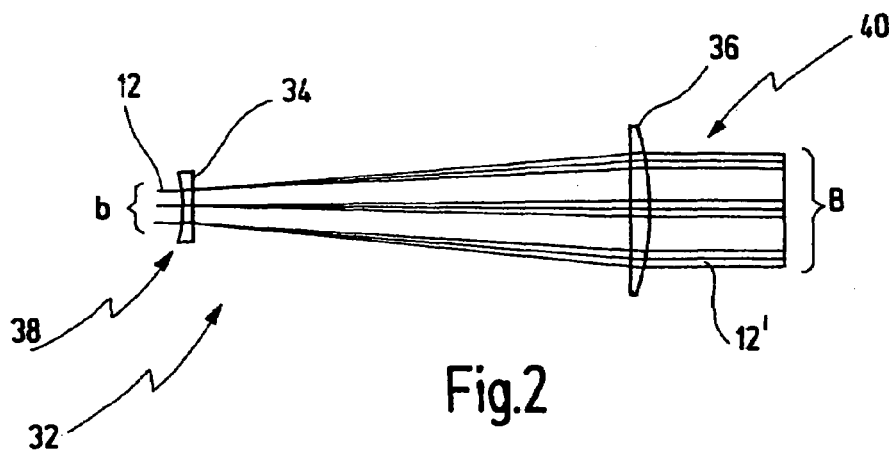
FIG. 2 shows a fundamental illustration of an expansion optic of a beam guiding optic of the arrangement in FIG. 1 by itself and on an enlarged scale.
Figure 3:
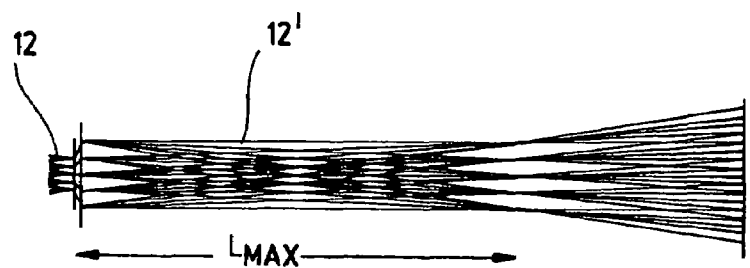
FIG. 3 shows a fundamental illustration of the beam path of the light beam of the arrangement in FIG. 1 for illustrating a maximum transmission path for obtaining a beam width B at the target location, in the illustration the imaging scale in the direction of the beam path differing from the imaging scale in the direction transversely with respect to the direction of light propagation.

For this purpose, FIG. 2 firstly illustrates the expansion optic 32 in FIG. 1 by itself and in an enlarged manner. Said expansion optic has an input 38 and an output 40. The expansion optic 32, as is illustrated in FIG. 2, may typically consist in a slightly focusing Kepler telescope (in this case, the expansion optic has two positive lenses 34 and 36) or in a Galilean telescope (in this case, the expansion optic has one negative and one positive lens). The expansion optic 32 is typically designed in such a way that the light beam is also collimated after its expansion, as is illustrated by the reference symbol 12' in FIG. 2.

The arrangement 10 is determined by the following parameters with respect to which the optical arrangement 10 has to be designed. These parameters are a beam width b with which the light source 14 generates the light beam 12, the natural divergence θ of the light beam 12, which is likewise determined by the light source 14, and the predetermined specified beam width B at the target location 16.

The expansion optic 32 has an expansion factor m which, in the case of previous systems, is determined as $$m = \frac{B}{b}$$

in accordance with the beam width B required at the target location 16 and the beam width b of the incident light beam 12.

In accordance with an expansion with the expansion factor $$m = \frac{B}{b},$$

the natural divergence of the light beam 12' is reduced after expansion to $$\theta = \frac{9}{m}.$$

The maximum transmission length for the light beam 12' along which the light beam 12' does not expand beyond the beam width B results from the natural divergence θ. As a result of this divergence, the light beam 12' will expand at every point in accordance with the product of divergence and distance I from the output 40 of the beam expansion optic 32 in accordance with B(I)=θ·I until its beam width is greater than the maximum specified beam width B. This distance $I_{MAX}$ corresponds to the maximum transmission length $L_{MAX}$. Therefore, the following holds true:

$$L_{MAX} = \frac{B}{\theta} = m \cdot \frac{B}{9} = m^2 \cdot \frac{b}{9}.$$

In order to keep the beam width B of the light beam 12' constant over the entire path distance L<$L_{MAX}$, the focal length f of the beam guiding optic 30 must be chosen to be slightly positive, to be precise equal to the above maximum transition length $L_{MAX}$, that is to say that f=MAX.

For this setting, the light beam 12' maintains its beam width B for path distances L<$L_{MAX}$. For path distances L>$L_{MAX}$, the light beam 12' will then widen in the manner illustrated in FIG. 3.

Given customary parameter specifications of present-day lasers, and due to the requirements made of the beam width B at the target location 16, the result, accordingly, is a maximum transmission path distance $L_{MAX}$ of the order of magnitude of 20-30 m if $$m = \frac{B}{b}$$

is chosen.

In the case of the optical arrangement 10 in FIG. 1, having the delay line 18, this means that the sum of the path distance $L_D$ and the actual path distance $L_S$ of the optical arrangement must be less than the previously specified maximum transmission path distance $L_{MAX}$. Otherwise, the delayed partial beam 26 would have diverged to a greater extent than the specified beam width B. In other words, the following must hold true: $L_S+L_D<L_{MAX}$ if divergence is to be avoided.

On the other hand, the delay line 18 serves to appreciably elongate or multiply the individual light pulses from which the light beam 12 is constructed, in order to reduce the peak power of each individual pulse. In order, by way of example, to achieve a pulse elongation of the order of magnitude of a few 10 ns, the path distance $L_D$ must be more than 10 m. This means that the maximum transmission path distance $L_{MAX}$ is reached very rapidly, so that such a system can only bridge very small path distances $L_S$.

If, by way of example, the light beam 12 has, from the light source 14 to the target location 16, a beam width b=10 mm and a divergence θ=2 mrad and if the beam width B at the target location 16 is intended to be 20 mm, this would conventionally be achieved by means of the expansion optic 32 having an expansion factor m=2. However, this results in a maximum transmission path distance $$L_{MAX} = m^2 \cdot \frac{b}{\theta} = 20 \text{ m}.$$

If the target location 16 is then situated at a path distance $L_S$=10 m away from the expansion optic 32 in accordance with FIG. 1, and if the delay line 18 has a path distance $L_D$=15 m (as a result of which a 50 ns pulse elongation is achieved), then the maximum transmission path distance $L_{MAX}$ is exceeded for the delayed partial beam 24, and the light beam 12' or 28 will unavoidably have a larger beam width B than the desired beam width B=20 mm at the output 22 or at the latest at the target location 16. This would correspondingly lead to light losses at the target location 16, for example the projection exposure installation.

This forms the starting point for the invention, which deviates from the conventional optical arrangements for beam guiding in accordance with the following principle.

The present invention is based on the fact that the light beam 12 on the input side or at least the delayed partial beam 24 is expanded at least once to a beam width B' that is greater than the beam width B required at the target location 16. In other words, the optical arrangement 10 in FIG. 1 uses at least one expansion optic whose expansion factor m brings about an expansion of the light beam 12 and/or of the delayed partial beam 24 that is greater than the beam width B required at the target location 16.

By way of example, it is possible to use an expansion optic having an expansion factor $$m = \alpha \cdot \frac{B}{b}$$

where α>1, b being the beam width of the incident light beam 12.

As a result, the maximum transmission path distance $L_{MAX}$ correspondingly increases quadratically, for example by four-fold if α=2 is chosen, generally by α²-fold. This ensures that the light beam 12' or 28 does not change its beam width either over the path distance $L_S$ or over the path distance $L_S+L_D$.

In order to obtain the required beam width B at the target location 16, use is then made of at least one compression optic that compresses the light beam 12' or 28 from the beam width B' to the beam width B.

If the previous numerical example is used with a beam width b of the light beam 12 generated by the light source 14 of b=10 mm and a divergence of θ=2 mrad and if the beam width B at the target location 16 is thus intended to be B=20 mm, and if the target location 16 is $L_S$=10 m away, then it is possible to have a path distance $L_D$ of 45 m for the delay line 18 if the expansion optic 32 used in FIG. 1 constitutes one which has an expansion factor of m=3.3, that is to say which expands the light beam 12 to a beam width B' of 33 mm. This is because the maximum transmission path distance $L_{MAX}$ is 55 m when the expansion optic 32 additionally has the positive focal length of f=55 m.

Figure 4:
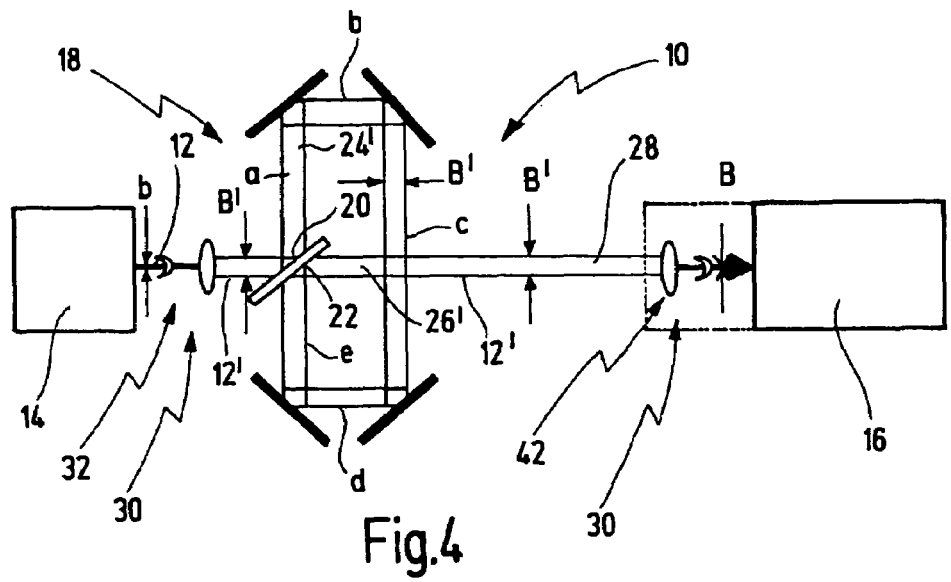
FIG. 4 shows a fundamental illustration of a first exemplary embodiment of an optical arrangement for beam guiding in accordance with the invention.

These facts are illustrated in a first exemplary embodiment in FIG. 4, in which case, in order to simplify the understanding of the invention, the same reference symbols as in FIG. 1 have been used in order to illustrate identical or corresponding parts of the optical arrangement 10.

In the case of the exemplary embodiment in FIG. 4, the beam guiding optic 30 has an expansion optic 32 that is arranged completely upstream of the input 20 of the delay line 18, that is to say that the input 38 and the output 40 of the expansion optic 32 are arranged upstream of the input 20 of the delay line 18, with the result that the beam splitting is effected in the collimated beam path.

The expansion optic 32 expands the light beam 12 to a beam width B' (and collimates it) which is greater than the beam width B required at the target location 16.

The expansion optic 32 has an expansion factor m, where m $$m \geq \sqrt{(L_S + L_D)} \cdot \frac{\vartheta}{b}.$$

By way of example, if the beam width b of the light beam 12 generated by the light source 14 is b =10 mm, as mentioned above, and has a divergence θ=2 mrad, and if the beam width B of the light beam 12' or 28 compressing the combined partial beams 24 and 26 is intended to be B =20 mm and if the expansion optic 32 is designed with an expansion factor of m =3.3, by way of example, then the light beam 12 has a beam width B'=33 mm after passing through the expansion optic 32. This corresponds to a maximum transmission path distance $L_{MAX}$=55 m, if the expansion optic 32 additionally has the positive focal length of f =55 m.

The light beam 12' has the same beam width B' over the entire path distance $L_S+L_D$, that is to say does not diverge proceeding from the beam width B' up to the target location 16. At the output 22 of the delay line 18, in particular, the delayed partial beam 24 and the non-delayed partial beam 26 have the same beam width B'.

In order to obtain the required beam width B at the target location 16, the beam guiding optic 30 has, downstream of the output 22 of the delay line 18, a compression optic 42 that compresses the light beam 12' or 28 to the beam width B, in the case of the numerical example described previously the compression optic then having a compression factor of m=0.6 in order to compress the light beam 12' or 28, having the beam width B'=33 mm, to the desired beam width B=20 mm again.

The compression optic 42 may also be part of the target location 16; in the case of a projection exposure installation, the compression optic 42 may be correspondingly integrated therein.

Figure 5:
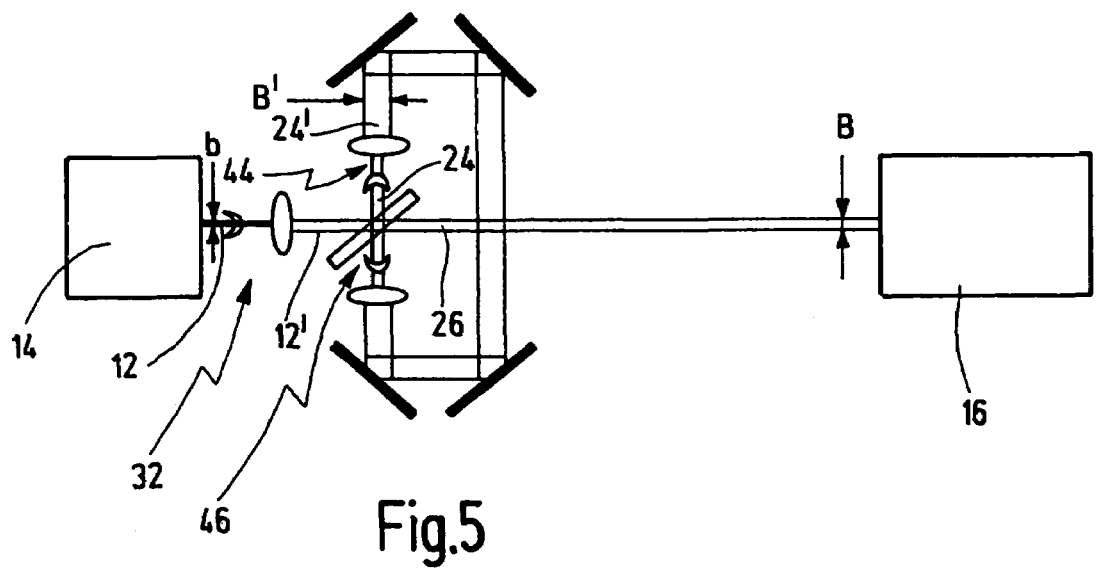
FIG. 5 shows a fundamental illustration of a second exemplary embodiment of an optical arrangement in accordance with the present invention.

Whereas in the case of the exemplary embodiment in FIG. 4 the light beam 12 is already completely expanded to the beam width B'>B and collimated upstream of the input of the delay line 18, in the case of the exemplary embodiment in accordance with FIG. 5 the light beam 12 coming from the light source 14 is firstly expanded once by means of the expansion optic 32, preferably to the beam width B that is intended to be present at the target location 16.

Said expansion optic 32 is arranged completely upstream of the input 20 of the delay line 18. The light beam 12 generated by the light source 14 is thus firstly expanded from the beam width b to the beam width B and collimated. This light beam 12' thus generated then impinges on the input 20 of the delay line 18 and is split into the first partial beam 24 and the second partial beam 26.

The first partial beam 24 is then expanded to the beam width B'>B by means of a further expansion optic 44, which is arranged completely in the delay line 18, here in the subdistance a, that is to say directly downstream of the input 20.

In this case, the expansion optic 44 has an expansion factor m for which $$m \geq \sqrt{L_D \cdot \frac{\vartheta}{b}}$$

is chosen, θ being the divergence and b being the beam width of the incident light beam 12. The expansion optic 44 generates a collimated light beam 24' having the beam width B'>B.

A compression optic 46 is correspondingly arranged upstream of the output 22 of the delay line 18, said compression optic reversing the expansion of the first partial beam 24 to the beam width B' again, to be precise the compression optic 46 here has a compression factor that is the inverse of the expansion factor m of the expansion optic 44, with the result that the first partial beam 24, at the output 22 of the delay line 18, preferably has the beam width B of the second partial beam 26.

The first expansion optic 32 has an expansion factor m that is preferably chosen in such a way that $$m \geq \sqrt{L_S \cdot \frac{\vartheta}{b}},$$

θ being the divergence and b being the beam width of the incident light beam 12.

The focal length f of the expansion optic 32 and the focal length of the expansion optic 44 are in each case chosen in such a way that $$f = m^2 \frac{B}{b},$$

m being the expansion factor of the expansion optic 32 and the expansion factor of the expansion optic 44, and b and θ respectively being the beam width and the divergence of the incident light beam 12.

Figure 6:
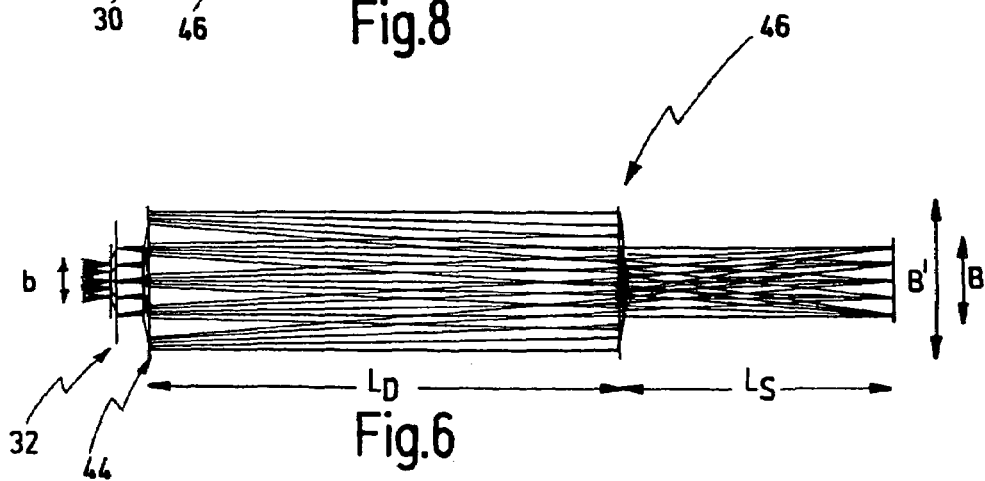
FIG. 6 shows a fundamental illustration of the beam guiding of the optical arrangement in FIG. 5.

FIG. 6 illustrates the principle of the additional expansion of the first partial beam 24 in the delay line 18 and also the principle of the beam path of the optical arrangement 10 in FIG. 5.

Figure 7:
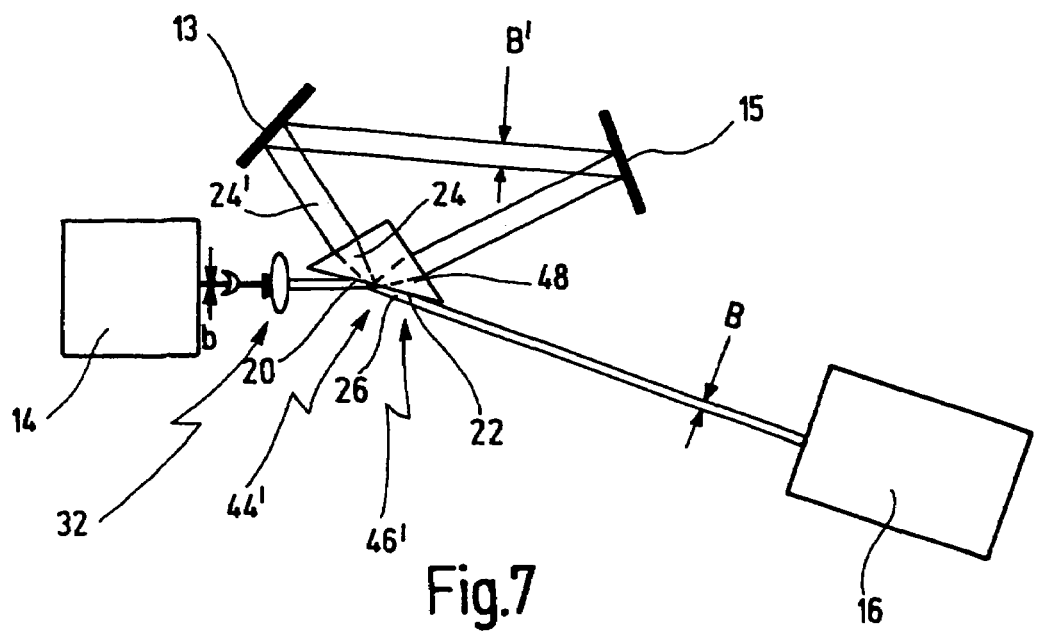
FIG. 7 shows a fundamental illustration of a third exemplary embodiment of an optical arrangement for beam guiding in accordance with the invention.

Whereas a traditional expansion optic in accordance with FIG. 2 (Kepler or Galilean telescope) was used for the additional expansion optic 44 or compression optic 46 in the delay line 18 in the case of the exemplary embodiment in FIG. 5, FIG. 7 illustrates an exemplary embodiment which is modified with respect to FIG. 5 and in which the additional expansion of the first partial beam 24 within the delay line 18 is realized by means of a prism system, by a prism in the present exemplary embodiment, 48. The prism simultaneously serves as a beam splitter element at the input 20 of the delay line 18 and as a beam combining element at the output 22 of the delay line 18, as a result of which, for the additional expansion and the splitting of the light beam 12 into the partial beams 24 and 26, overall only one device is required or it is possible at least to reduce the number of devices.

Figure 8:
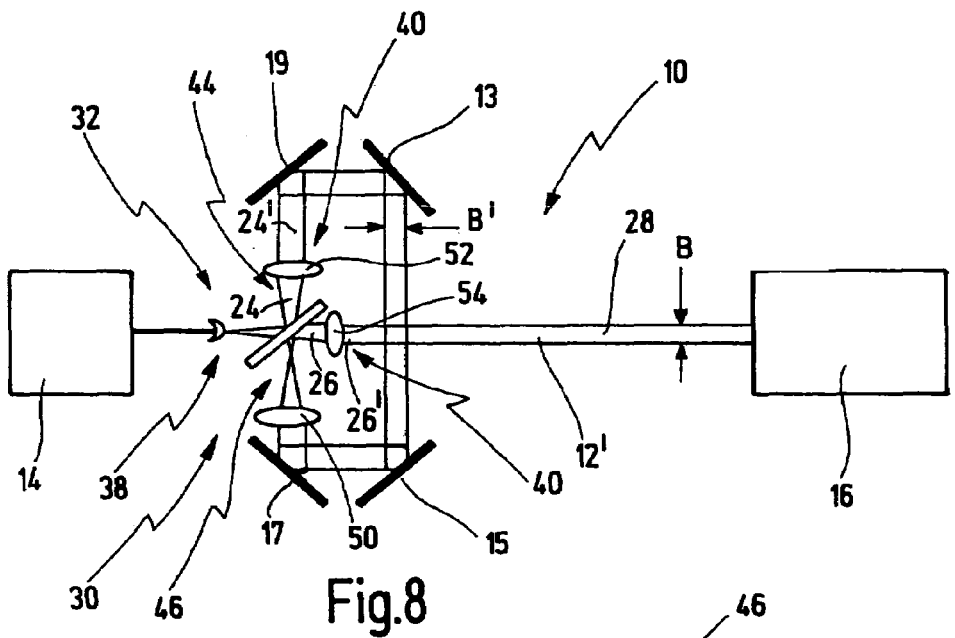
FIG. 8 shows a fundamental illustration of a fourth exemplary embodiment of an optical arrangement for beam guiding in accordance with the invention.

Finally, FIG. 8 illustrates yet another exemplary embodiment. Whereas in the case of the exemplary embodiments in accordance with FIGS. 4 to 7 the beam splitting is effected at the input 20 of the delay line 18 and/or the beam combination is effected at the output 22 of the delay line 18 in the collimated, i.e. parallel, beam path, in the case of the exemplary embodiment in accordance with FIG. 8 the beam splitting takes place in the expanding beam path and/or the beam combination takes place in the tapering beam path.

The beam guiding optic 30 of the optical arrangement 10 correspondingly has a first expansion optic 32, the input 38 of which is arranged upstream of the input 20 of the delay line 18 and the output 40 of which is arranged downstream of the output 22 of the delay line 18, in each case as seen in the beam direction.

The beam guiding optic 30 of the optical arrangement 10 furthermore has a second expansion optic 44, which uses the same input 38 of the first expansion optic 32 but has a dedicated output 48, which is arranged in the beam path of the first partial beam 24, to be precise is arranged downstream of the input 20 of the delay line 18.

The compression optic 46 has, merely by way of example, a positive lens 50 whose optical properties are essentially identical to the optical properties of the lens of the output 48 of the second expansion optic 44, the output 48 of the second expansion optic 38 likewise being formed, by way of example, by a lens 52.

The second expansion optic 44 expands the first partial beam 24 to the beam width B' again, while the first expansion optic 32 has an expansion factor m that expands the non-delayed partial beam 26 to the beam width B downstream of the output 22 of the delay line 18. The compression optic 46 has the effect that the delayed partial beam 24 and the non-delayed partial beam 26, at the output 22 of the delay line 18 and at the output 40 of the first expansion optic 32, respectively, have the same beam width B.

If the focal lengths f of the positive lenses 50, 52 and 54 are chosen to be identical, then the expansion factors of the expansion optics 32 and 34 are identical. By contrast, if said focal lengths are chosen to be different, then it is possible to generate different expansions, by way of example a greater expansion in the delay line 18 than in the direct beam path of the second partial beam 26.

This arrangement affords the advantage that it is possible to adjust the overall focal length of the expansion optic in the direct beam path to the target location 16 and in the delay line 18 independently of one another by slightly shifting the positive lenses 52 or 50 and 54 and it is thus possible to compensate for slight refractive powers—possibly caused by tolerances of the deflection mirrors 13-19—in said mirrors.

As already mentioned, it is possible to design the expansion optics in the previously described exemplary embodiments and the compression optics independently of one another as Galilean telescopes (negative and positive lens) or as Keppler telescopes (two positive lenses).

Moreover, it is possible to form these telescopes with cylindrical lenses or by combinations of cylindrical and spherical lenses, so that it is possible to produce different expansion factors or compression factors in two mutually different directions, for example in the horizontal and vertical directions. This is advantageous in particular when the light beam 12 has different characteristic quantities, i.e. different beam width and divergence in two mutually perpendicular planes perpendicular to the beam direction.

In principle, the expansion optics may also be realized solely by prism systems which may have, as in FIG. 7, one prism but also a plurality of prisms.

Depending on the parameters of the light source 14, or depending on the divergence θ of the beam width b of the light beam 12 generated by the light source 14, it may also suffice within the scope of the invention to perform an expansion or compression in only one direction, e.g. horizontal or vertical, in order to obtain the desired maximum transmission path distance $L_{MAX}$.

What is claimed is:

1. A method for beam guiding of a light beam generated by a light source to a target location along a path distance $L_S$, comprising splitting said light beam on said path distance $L_S$ at least once into a first partial beam and a second partial beam, guiding said first partial beam additionally at least once along a delay line, said first partial beam thereby covering an additional path distance $L_D$, guiding said second partial beam only along said path distance $L_S$, combining said first and second partial beams after said first partial beam having passed through said delay line and guiding the combined beam to said target location, wherein said light beam is guided along said path distance $L_S$ and $L_D$ in such a way that said light beam generated by said light source has a predetermined beam width B at said target location, expanding said light beam between said light source and said target location at least once to a beam width B'>B and compressing said light beam again at least once in such a way that said light beam has said predetermined beam width B at said target location.

2. The method of claim 1, wherein said light beam is expanded to a beam width B' completely before said first partial beam enters into said delay line, and said light beam is compressed to said predetermined beam width B between an output of said delay line and said target location.

3. The method of claim 1, wherein said first partial beam is expanded to a beam width B'>B after entering into said delay line, and is compressed before emerging from said delay line.

4. The method of claim 3, wherein said light beam is shaped to said beam width B upstream of said delay line and said first partial beam is expanded from said beam width B to said beam width B'>B in said delay line and is compressed to said beam width B upstream of an output of said delay line.

5. The method of claim 1, wherein said light beam is expanded upstream of said delay line in such a way that said splitting of said light beam into said first partial beam and said second partial beam is effected when said light beam expands, said first partial beam, after said splitting, then being expanded to a beam width B'>B, and said second partial beam being expanded to said predetermined beam width B, and said first partial beam being compressed to said beam width B at an end of said delay line.

6. An optical arrangement for beam guiding of a light beam generated by a light source to a target location along a path distance $L_S$, comprising
at least one delay line having an input at which said light beam coming from said light source is split into a first partial beam which additionally passes through said delay line at least once, thereby covering a path distance $L_D$, and into a second partial beam that does not pass through said path distance $L_D$, and an output at which said delayed first and said non-delayed second partial beam are combined so that the combined light beam passes to said target location,
a beam guiding optic being present in said beam path and being designed in such a way that said light beam generated by said light source has a predetermined beam width B at said target location, said beam guiding optic having at least one expansion optic, which expands said light beam to a beam width B'>B, and said beam guiding optic having at least one compression optic, with the result that said light beam has said predetermined beam width B at said target location.

7. The arrangement of claim 6, wherein the at least one expansion optic has an expansion factor $$m = \alpha \cdot \frac{B}{b},$$

where $\alpha > 1$, b being the beam width of the incident light beam.

8. The arrangement of claim 6, wherein the at least one expansion optic is arranged completely upstream of said input of said delay line.

9. The arrangement of claim 8, wherein the at least one expansion optic has an expansion factor $$m \geq \sqrt{(L_S + L_D) \cdot \frac{\vartheta}{b}},$$

$\theta$ being the divergence and b being the beam width of the incident light beam.

10. The arrangement of claim 6, wherein said at least one compression optic is arranged in a region between said output of said delay line and said target location.

11. The arrangement of claim 6, wherein said at least one compression optic is integrated in said target location.

12. The arrangement of claim 6, wherein said at least one expansion optic is arranged completely in said delay line.

13. The arrangement of claim 12, wherein said at least one expansion optic has an expansion factor $$m \geq \sqrt{L_D \cdot \frac{\vartheta}{b}},$$

$\theta$ being the divergence and b being the beam width of the incident light beam.

14. The arrangement of claim 6, wherein said at least one expansion optic is arranged completely in said delay line, and wherein said at least one compression optic is likewise arranged in said delay line and is designed in such a way that said expansion of said light beam by said expansion optic is reversed upstream of said output of said delay line, with the result that said first partial beam emerging from said delay line has the same beam width as said non-delayed second partial beam.

15. The arrangement of claim 6, wherein said at least one expansion optic is arranged completely in said delay line, and wherein said beam guiding optic has at least one further expansion optic, which is arranged completely upstream of said input of said delay line.

16. The arrangement of claim 15, wherein said further expansion optic has an expansion factor $$m \geq \sqrt{L_S \cdot \frac{\vartheta}{b}},$$

$\theta$ being the divergence and b being the beam width of the incident light beam.

17. The arrangement of claim 6, wherein said at least one expansion optic is arranged completely in said delay line, and wherein said beam guiding optic has at least one further expansion optic, which is arranged completely upstream of said input of said delay line, wherein an expansion factor of said further expansion optic is different from an expansion factor of said at least one first expansion optic.

18. The arrangement of claim 6, wherein said at least one expansion optic has an optical input and an optical output, which in interaction bring about said beam expansion, and wherein said input of said expansion optic is arranged upstream of said input of said delay line, and said at least one output of said expansion optic is arranged within said delay line.

19. The arrangement of claim 18, wherein said at least one compression optic is arranged within said delay line.

20. The arrangement of claim 6, wherein said at least one expansion optic has an optical input and an optical output, which in interaction bring about said beam expansion, and wherein said input of said expansion optic is arranged upstream of said input of said delay line and said at least one output of said expansion optic is arranged within said delay line, and wherein said beam guiding optic has at least one further expansion optic having an optical input and having an optical output that is arranged in the beam direction downstream of said output of said delay line.

21. The arrangement of claim 20, wherein said optical input of said further expansion optic is identical to said optical input of said first expansion optic.

22. The arrangement of claim 21, wherein said first expansion optic and said at least one further expansion optic have different expansion factors.

23. The arrangement of claim 22, wherein said expansion factor of said first expansion optic is greater than said expansion factor of said at least one further expansion optic.

24. The arrangement of claim 6, wherein a focal length f of said at least one expansion optic is chosen in such a way that $$f = m^2 \cdot \frac{b}{\partial},$$

m being the expansion factor of said expansion optic, θ being the divergence and b being the beam width of the incident light beam.

25. The arrangement of claim 24, wherein said focal length f of said at least one expansion optic differs in directions that are different with respect to the beam propagation of said light beam and with respect to one another.

26. The arrangement of claim 6, wherein said at least one expansion optic is formed in such a way that said beam expansion differs in at least two directions that are different with respect to the beam direction and with respect to one another.

27. The arrangement of claim 6, wherein said at least one expansion optic is formed as a lens system comprising at least one of spherical and cylindrical lenses.

28. The arrangement of claim 6, wherein said expansion optic has at least one prism.

29. The arrangement of claim 28, wherein said at least one prism additionally serves as a beam splitter at said input.

30. The arrangement of claim 28, wherein said at least one prism additionally serves as a beam combining element at said output of said delay line.

31. The arrangement of claim 6, wherein said at least one expansion optic is formed by a mirror system.

32. The arrangement of claim 6, wherein said beam guiding optic has at least one optical element with variable refractive power, which enables an adjustment of a focal length of said beam guiding optic.

33. The arrangement of claim 6, wherein said beam guiding optic has at least one optical element with variable refractive power which enables a compensation of undesirable refractive powers.

34. The arrangement of claim 6, wherein said beam guiding optic has at least one optical element with variable refractive power which enables an adaptation of said beam guiding to different path distances.

35. The arrangement of claim 34, wherein the at least one optical element is a deformable mirror.

36. The arrangement of claim 34, wherein said at least one optical element is a displaceable lens.

37. A semiconductor lithography system, comprising an optical arrangement for beam guiding of a light beam generated by a light source to a target location along a path distance $L_S$, comprising at least one delay line having an input at which said light beam coming from said light source is split into a first partial beam which additionally passes through said delay line at least once, thereby covering a path distance $L_D$, and into a second partial beam that does not pass through said path distance $L_D$, and an output at which said delayed first and said non-delayed second partial beam are combined so that the combined light beam passes to said target location, a beam guiding optic being present in said beam path and being designed in such a way that said light beam generated by said light source has a predetermined beam width B at said target location, said beam guiding optic having at least one expansion optic, which expands said light beam to a beam width B'>B, and said beam guiding optic having at least one compression optic, with the result that said light beam has said predetermined beam width B at said target location.

* * * * *